SOLID-STATE, AMPLITUDE-MODULATED, WIDEBAND, RADIO-FREQUENCY NOISE GENERATOR
Filed Jan. 9, 1968
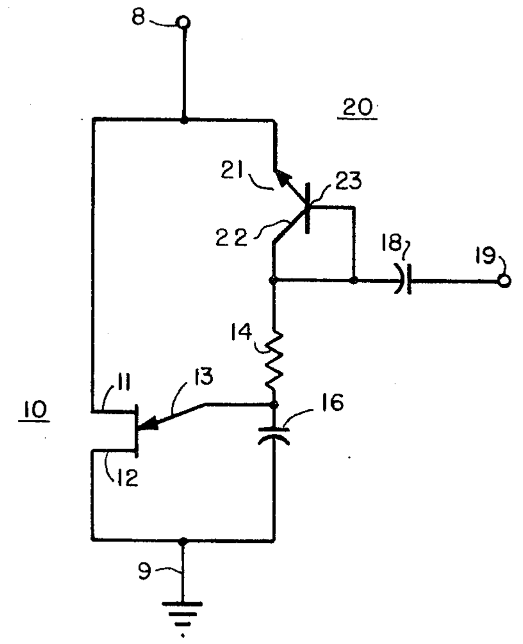
INVENTORS
RUSSELL A. GILSON &
RANDY A. REITMEYER.
BY Charles F. Gunderson AGENT.
Harry M. Saragovitz,
Edward J. Kelly & Herbert Berl
ATTORNEYS.

United States Patent Office 3,514,716
Patented May 26, 1970

3,514,716

SOLID-STATE, AMPLITUDE-MODULATOR, WIDE-BAND RADIO-FREQUENCY NOISE GENERATOR

Russell A. Gilson and Randy A. Reitmeyer, Asbury Park, N.J., assignors to the United States of America as represented by the Secretary of the Army Filed Jan. 9, 1968, Ser. No. 696,586
Int. Cl. H03b *29/00*
U.S. Cl. 331—78 1 Claim

ABSTRACT OF THE DISCLOSURE

This disclosure relates to noise generators and particularly to solid-state, amplitude-modulated noise generators. More particularly this disclosure describes the connection of a reverse-biased, noise-generating, solid-state junction in a relaxation-oscillator circuit to produce an amplitude-modulated, wideband noise signal.

The invention described herein may be manufactured and used by or for the Government for Governmental purposes without the payment to use of any royalties thereon.

BACKGROUND OF THE INVENTION

There are many noise-generating devices and systems, with and without modulating means. Some of the more recent noise generating systems employ solid-state devices and rely on the noise produced by current flow, usually in the reverse direction, through one of the junctions. The best of these devices are probably the reverse-biased Zener diodes or diode-connected transistors with reverse-biased, base to emitter connections. These devices appear to produce the best modulation characteristics and tone quality and the best, wideband noise characteristics because they have the sharpest breakdown characteristics.

Wideband amplitude-modulated noise generators are useful for supplying a test signal for a quick determination of the operability of a radio receiver of any frequency. However, for use in the field, it becomes desirable to have a noise generator that is as compact, as efficient, as fool proof, and as rugged as possible.

The object of this invention is to provide a noise generator that will produce easily-detectable, amplitude-modulated signals over the widest possible band of radio frequencies; a generator that has as few components as possible, for simplicity, and these components are of miniature or micro-miniature types; a generator that has a minimum of wiring, and the wiring is adaptable to printed circuit techniques; and a generator that has as low a current drain as possible for the desired output.

SUMMARY OF THE INVENTION

The objects of this invention are achieved by connecting a reverse-biased, noise-generating, emitter-base junction of a diode-connected transistor directly into one of the current-carrying branches of a relaxation-oscillator circuit. The oscillator power supply provides the reverse-bias current through the emitter-base junction, to generate the radio-frequency noise, as well as providing the current for the normal functioning of the oscillator circuit. The wideband radio-frequency noise generated by the reverse-biased, emitter-base junction of the transistor is amplitude modulated at an audible frequnecy by the relaxation oscillator.

BRIEF DESCRIPTION OF THE DRAWING

The drawing is a circuit diagram of a typical noise-generating device in accordance with this invention.

DESCRIPTION OF THE PREFERRED EMBODIMENT

Referring to the drawing, a unijunction transistor 10 has its two base electrodes 11 and 12 connected across power supply terminals 8 and 9 and its emitter electrode 13 connected to the junction between a resistor 14 and a capacitor 16.

A transistor 20 has electrodes 22 and 23 of its collector-base junction connected together and electrodes 21 and 23 of its emitter-base junction connected in series with the resistor 14 between the positive terminal 8 of the power supply and the emitter electrode 13 of the transistor 10. The emitter electrode of transistor 20 is connected to the positive terminal 8 of the power supply to function as a reverse-biased diode. The capacitor 16 is connected between the emitter electrode 13 and the grounded, negative terminal 9 of the power supply.

The operation of the relaxation oscillator is well known. The current through the resistor 14 charges the capacitor 16 and raises the voltage across the terminals 12 and 13 of the unijunction transistor until the firing-level voltage is reached.

The capacitor 16 then discharges through the unijunction transistor 10 to complete the cycle. The length of time it takes to charge the capacitor to the firing-level voltage is controlled by the capacitance and the resistance of the capacitor 16 and resistor 14 respectively.

In this circuit the connection of the reverse-biased, emitter-base junction of the transistor 20 in series with the resistor 14 provides a source of radio frequency noise since the charging current for the capacitor must pass through the noise-generating junction as well as through the resistor 14. This radio-frequency noise appears as alternating voltage across the resistor 14 and this alternating voltage may be coupled, through a capacitor 18, to any desired output 19. The radio-frequency noise generated by the junction of the diode-connected transistor 20 is amplitude modulated by the variation in the current through the resistor 14 during the charging and discharging cycle of the capacitor 16 of the relaxation oscillator.

In this typical embodiment of this invention the unijunction transistor 10 is a 2N2646 type and the transistor 20 is a 2N918 type. The resistor 14 is 22,000 ohms and the capacitor 16 is .047 microfarad. The terminal 8 of the power supply supplies 30 volts positive with respect to the grounded terminal 9. This gives radio-frequency signals of amplitudes within the useable sensitivity of typical AM receivers, over a band from .5 to 400 megacycles, modulated at 1000 cycles.

While typical transistors and circuit values are shown here it will be obvious to anyone skilled in the art that other types of transistors or diodes can be used with suitable variations in connections. For example, a Zener diode could be used in place of the diode-connected transistor 20. It will be obvious, also, that certain minor changes can be made in the circuit of the relaxation oscillator, or the positions of the elements in the circuit within the teachings of this invention.

What is claimed is:

1. In an amplitude-modulated noise generator comprising a power supply, a resistor, a first capacitor, a second capacitor; a unijunction transistor, a diode-connected transistor and an output circuit; means for connecting the emitter electrode of said diode-connected transistor to the positive terminal of said power supply; means for connecting said resistor between the base electrode of said diode-connected transistor and the emitter electrode of said unijunction transistor; means for connecting said first capacitor between said emitter electrode of said unijunction transistor and the negative terminal of said power supply; means for connecting the base-1 electrode of said unijunction transistor to said negative terminals of said power supply; means for connecting the base-2 electrode of said unijunction transistor to said positive terminal of said power supply; and means for connecting said second capacitor between said base electrode of said diode-connected transistor and said output circuit.

References Cited

UNITED STATES PATENTS 3,327,044 6/1967 Markowitz ------------ 331—78

JOHN KOMINSKI, Primary Examiner